(12) United States Patent
Morris et al.

(10) Patent No.: US 9,236,898 B2
(45) Date of Patent: Jan. 12, 2016

(54) MULTI-BAND OBSERVATION RECEIVER

(71) Applicant: Telefonaktiebolaget L M Ericsson (publ), Stockholm (SE)

(72) Inventors: Bradley John Morris, Ottawa (CA); Somsack Sychaleun, Ottawa (CA)

(73) Assignee: TELEFONAKTIEBOLAGET L M ERICSSON (PUBL), Stockholm (SE)

( * ) Notice: Subject to any disclaimer, the term of this patent is extended or adjusted under 35 U.S.C. 154(b) by 0 days.

(21) Appl. No.: 14/581,121

(22) Filed: Dec. 23, 2014

(65) Prior Publication Data

US 2015/0110223 A1    Apr. 23, 2015

Related U.S. Application Data

(63) Continuation of application No. 13/558,837, filed on Jul. 26, 2012, now abandoned.

(51) Int. Cl.
| | |
|---|---|
| H04L 25/03 | (2006.01) |
| H04B 1/62 | (2006.01) |
| H04L 27/26 | (2006.01) |
| H03F 1/32 | (2006.01) |
| H04L 27/36 | (2006.01) |
| H03F 3/24 | (2006.01) |
| H04B 1/04 | (2006.01) |

(52) U.S. Cl.
CPC ............ *H04B 1/62* (2013.01); *H03F 1/3241* (2013.01); *H03F 1/3247* (2013.01); *H03F 3/24* (2013.01); *H04L 27/2626* (2013.01); *H04L 27/367* (2013.01); *H04B 2001/0425* (2013.01)

(58) Field of Classification Search
CPC ....... H03F 1/3247; H03F 1/32; H03F 1/3241; H04L 27/368; H04B 1/0475; H04B 1/62; H04B 2001/0425
See application file for complete search history.

(56) References Cited

U.S. PATENT DOCUMENTS

| | | | |
|---|---|---|---|
| 6,798,843 B1 | 9/2004 | Wright et al. | |
| 7,058,369 B1 | 6/2006 | Wright et al. | |
| 7,295,815 B1 | 11/2007 | Wright et al. | |
| 7,340,223 B1 | 3/2008 | Wright et al. | |
| 8,355,682 B2 * | 1/2013 | Kenington | ................. 455/114.3 |
| 8,391,809 B1 | 3/2013 | Fuller | |
| 2001/0054974 A1 | 12/2001 | Wright | |
| 2002/0021764 A1 | 2/2002 | Posti | |
| 2003/0156658 A1 | 8/2003 | Dartois | |

(Continued)

FOREIGN PATENT DOCUMENTS

| | | |
|---|---|---|
| WO | 2005/112254 A1 | 11/2005 |
| WO | 2007/117189 A1 | 10/2007 |

OTHER PUBLICATIONS

International Search Report in corresponding International Application No. PCT/IB2013/002201 mailed Feb. 5, 2014.

(Continued)

*Primary Examiner* — Kenneth Lam
(74) *Attorney, Agent, or Firm* — Patent Portfolio Builders PLLC

(57) ABSTRACT

Transmitter observation receivers and methods are described that can predistortion-compensate transmitters capable of operating in multiple communication bands and frequency ranges. Such observation receivers and method involve generating at least one compensation signal such that a signal to be transmitted that is within a bandwidth that simultaneously encompasses multiple frequency ranges is compensated.

6 Claims, 6 Drawing Sheets

(56) References Cited

U.S. PATENT DOCUMENTS

| | | |
|---|---|---|
| 2004/0032912 A1 | 2/2004 | Ocenasek et al. |
| 2004/0179629 A1 | 9/2004 | Song et al. |
| 2006/0240786 A1 | 10/2006 | Liu |
| 2007/0190952 A1 | 8/2007 | Waheed et al. |
| 2008/0144539 A1 | 6/2008 | Sperlich et al. |
| 2009/0201084 A1 | 8/2009 | See et al. |
| 2010/0283540 A1* | 11/2010 | Davies .................... 330/149 |
| 2012/0069931 A1 | 3/2012 | Gandhi et al. |
| 2012/0128082 A1 | 5/2012 | Morris et al. |
| 2012/0128099 A1* | 5/2012 | Morris et al. ................ 375/297 |
| 2012/0154038 A1 | 6/2012 | Kim et al. |
| 2013/0027129 A1 | 1/2013 | Langer |
| 2014/0079153 A1 | 3/2014 | Kim et al. |

OTHER PUBLICATIONS

Written Opinion of the International Searching Authority in corresponding International Application No. PCT/IB2013/002201 mailed Feb. 5, 2014.

* cited by examiner

MULTI-BAND OBSERVATION RECEIVER

TECHNICAL FIELD

This invention relates to electronic communication systems and more particularly to pre-distortion-compensated transmitters in such systems and even more particularly to observation receivers and techniques in such transmitters.

BACKGROUND

Many current electronic communication systems use quadrature modulation schemes, which involve in-phase (I) and quadrature (Q) signal components and do not have constant envelopes. Examples of such communication systems are cellular radio telephone systems that use wideband code division multiple access (WCDMA), orthogonal frequency division multiple access (OFDMA), and their variants. Thus, part of the communicated information is encoded in the amplitude (envelope) of the transmitted signal and part is encoded in the phase of the transmitted signal.

To avoid distorting communicated information, the power amplifier (PA) and various other components of a radio transmitter have to be linear, which is to say for example that the functional relationship between the output power of the PA and the input power of the PA is a straight line for all possible power levels. In addition, the phase shift of the input signal through the PA has to be constant for all possible power levels.

Departures from amplitude linearity and phase constancy introduce distortion into the PA's output signal, such as spectral broadening that can disturb nearby communication channels. Amplitude/phase distortion (vector distortion) in the transmitter can also increase the bit error rate (BER) of the communication system, e.g., degrading the audio quality of a voice call or reducing the speed of an internet connection.

In general, the likelihood of proper transmitter performance can be increased by including in the transmitter a transmitter observation receiver (TOR) that samples the output signal of the PA and generates a compensation signal that is fed back to the modulator, PA, and/or other transmitter components to correct the PA's output signal. In effect, the compensation signal pre-distorts the transmitter input signal such that the PA's output signal is apparently undistorted. Since transmitter distortion typically arises mainly in the PA, a signal acquired after the PA is fed back and compared with the transmitter input signal as part of the pre-distortion process.

FIG. 1 is a block diagram of an arrangement 100 that is an example of a pre-distortion-compensated transmitter having an antenna 102, a coupler 104, a power amplifier 106, a modulator 108, and a TOR 110. The PA 106 and modulator 108 can be considered the "transmit path" of the arrangement 100. It will be understood that the modulator 108 typically includes oscillators and other components not shown and that the modulator 108 generally represents the base-band processing and up-conversion processing applied to the input signal. As seen in FIG. 1, the TOR 110 samples the transmitted signal generated by the transmit path through the operation of the coupler 104 and provides a compensation signal to the modulator 108.

Currently available pre-distortion-compensated transmitters are generally designed to operate over a small range of transmitted frequencies, such as a communication band of a communication system. For example, the Long Term Evolution (LTE) communication system currently being standardized by the Third Generation Partnership Project (3GPP) has a communication Band 1 that covers 2110-2170 megahertz (MHz). Both the forward transmit path and the feedback compensation path in the transmitter are effectively tuned to the same range of frequencies, and cannot be deployed to support other frequency ranges, e.g., other communication bands. The typical transmitter operation is constrained to a single (narrow) frequency range of interest as a result of spectral linearity limitations of its various tuned circuits (e.g., narrow-band filters) and tunable circuits (e.g., voltage-controlled local oscillators). For example, amplitude and phase variation over frequency makes linearization (pre-distortion) difficult over a broad range of frequencies, and an oscillator may be able to tune over only a few hundred MHz.

FIG. 2 is a block diagram that depicts a known way to use a single TOR in a single-frequency, multi-transmitter arrangement. The multiple transmitters generate respective signals having the same carrier frequency, e.g., any carrier in a communication band, of a communication system. In the arrangement 200 depicted in FIG. 2, an antenna 202-1 receives output signals of a Tx 1 PA 206-1 and an antenna 202-2 receives output signals of a Tx 2 PA 206-2 that have a respective Tx 1 modulator 208-1 and a Tx 2 modulator 208-2. Couplers 204-1, 204-2 provide portions of the output signals of the PAs to a single TOR 210 through operation of a switch 212. The TOR 210 samples the output signal connected to it by the switch 212 without needing tuning and provides a compensation signal to the respective modulator. In this way, the single TOR 210 is essentially time-shared sequentially between the PAs 206-1, 206-2, each PA producing a signal in the same frequency range. It is believed that such an arrangement was available from Nortel in its CDMA tri-sector radio.

The frequency limitations of TORs and pre-distortion-compensated transmitters are becoming more serious problems as the number and range of available communication bands around the world increases. Currently available pre-distortion-compensated transmitters require redesign, modification and re-banding to operate in new communication bands, and this increases the cost of designing and supporting communication systems.

SUMMARY

Problems and disadvantages of previous transmitters are overcome by methods and arrangements in accordance with this invention.

In accordance with aspects of this invention, there is provided an arrangement for a pre-distortion-compensated transmitter for a communication system. The arrangement includes an electronic processor circuit configured for converting a base-band signal to be transmitted to a spectrally shifted, pre-distorted signal to be transmitted based on at least one compensation signal; a power amplifier configured for generating an amplified version of the spectrally shifted, pre-distorted signal to be transmitted, where the amplified version is in one frequency range of a plurality of frequency ranges used in the communication system; a coupler configured for generating a sample signal from the amplified version; and a transmitter observation receiver (TOR) configured for receiving the sample signal and generating at least one compensation signal based on the sample signal. The at least one compensation signal is generated such that a signal to be transmitted that is within a bandwidth that simultaneously encompasses multiple frequency ranges is compensated. The electronic processor circuit converts the base-band signal to be transmitted such that a relationship between the base-band signal to be transmitted and the sample signal is substantially linear with constant phase.

Also in accordance with aspects of this invention, there is provided a method of pre-distortion-compensating a signal to be transmitted for a communication system. The method includes converting a base-band signal to be transmitted to a spectrally shifted, pre-distorted signal to be transmitted based on at least one compensation signal; generating an amplified version of the spectrally shifted, pre-distorted signal to be transmitted, where the amplified version is in one frequency range of a plurality of frequency ranges used in the communication system; generating a sample signal from the amplified version; and generating at least one compensation signal based on the sample signal such that a signal to be transmitted that is within a bandwidth that simultaneously encompasses multiple frequency ranges is compensated. The base-band signal to be transmitted is converted such that a relationship between the base-band signal to be transmitted and the sample signal is substantially linear with constant phase.

BRIEF DESCRIPTION OF THE DRAWINGS

The several objects, features, and advantages of this invention will be understood by reading this description in conjunction with the drawings, in which.

DETAILED DESCRIPTION

This invention can be implemented in many types of communication system that use pre-distortion compensation of a signal transmitter. This description of examples of embodiments of the invention refers to the accompanying drawings, in which the same or similar reference numbers in different drawings identify the same or similar components.

In response to the increasing number and range of available communication bands around the world, transmitters capable of operating in multiple communication bands are beginning to be developed. TORs can improve such multi-band transmitters, and can be included in multi-band transmitters in a number of ways.

Figure 1:
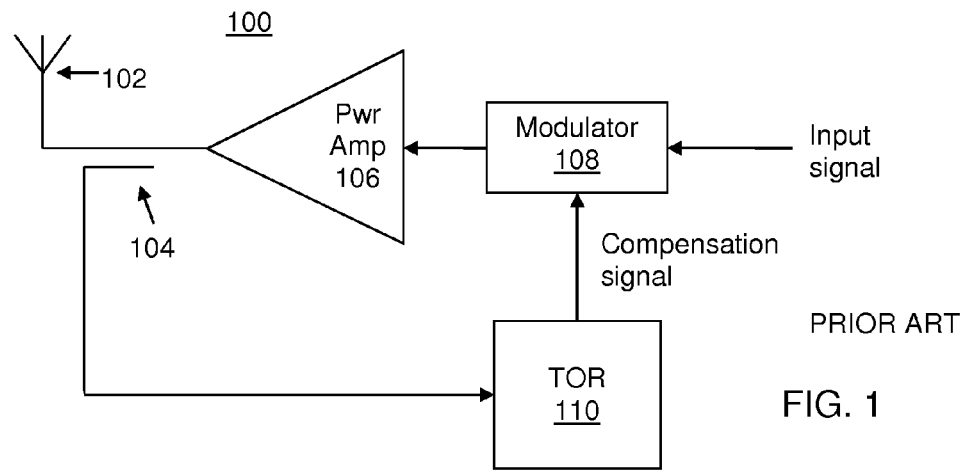
FIG. 1 is a block diagram of a known single-frequency pre-distortion-compensated transmitter.
Figure 2:
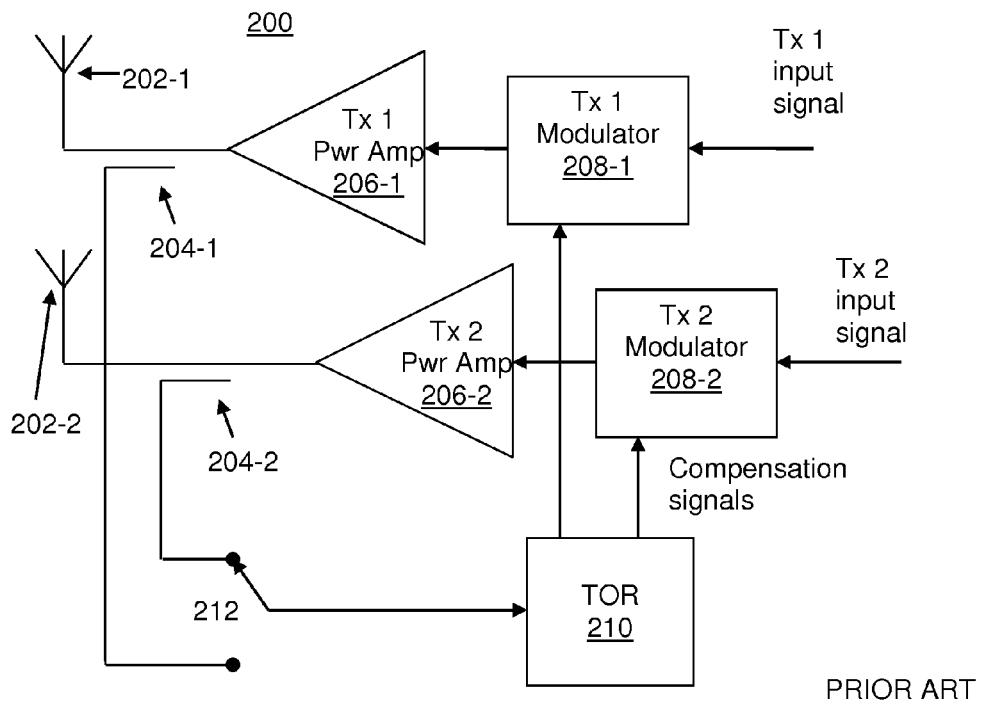
FIG. 2 is a block diagram of a single-frequency, multi-transmitter arrangement having a shared observation receiver.
Figure 3:
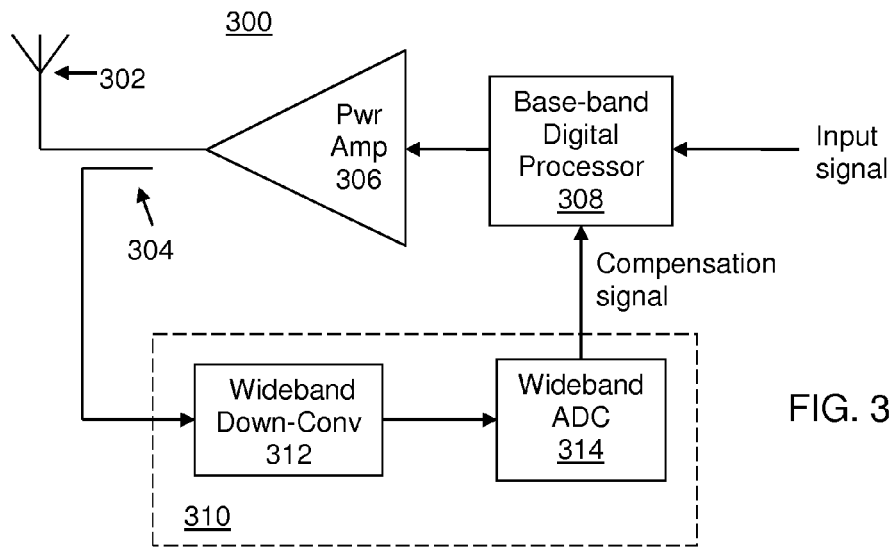
FIG. 3 is a block diagram of a multi-band pre-distortion-compensated transmitter having a wideband analog observation receiver.

FIG. 3 is a block diagram of an arrangement 300 that is an example of a pre-distortion-compensated transmitter having a single TOR that must have sufficient bandwidth to see all relevant communication bands and all related distortion if it is to be able to compensate a signal to be transmitted that is within a bandwidth that simultaneously encompasses all relevant communication bands. The transmitter 300 has an antenna 302, a coupler 304, a PA 306, and a base-band digital processor 308. The PA 306 and processor 308 can be considered the transmit path of the arrangement 300. A TOR 310 depicted in FIG. 3 includes a wideband down-converter 312, such as a wideband quadrature demodulator, and a wideband analog-to-digital converter (ADC) 314 that converts the wideband analog signal produced by the down-converter 312 into a digital wideband compensation signal provided to the processor 308.

As described above, a TOR is generally specifically tuned to operate in one frequency range, such as a part or all of one communication band, due to very stringent analog performance (gain and phase) requirements, and this currently makes it difficult to implement the single TOR 310 for operation over multiple communication bands. The bandwidth needed by the TOR 310 depends on the frequency range within which the signal to be transmitted by the transmitter 300 can be found, which can be a bandwidth that simultaneously encompasses a plurality of communication bands.

For example, if the transmitter 300 is configured for dual-band operation, e.g., to generate a 40-MHz-wide signal in Band 3 and a 40-MHz-wide signal in Band 1, then the TOR 310 must generate a compensation signal such that those signals to be transmitted can be compensated, which in this example is a compensation signal within a bandwidth that simultaneously encompasses both Band 1 and Band 3. The compensation signal is thus generated in a bandwidth of at least 1095 MHz (i.e., (2170−1805 MHz)×3). To have such a wide bandwidth, the TOR 310 requires significant power, circuit area, and cost, and optimization (for gain flatness, phase linearity, etc.) of the TOR 310 over such a wide bandwidth is difficult. The difficulties increase dramatically as the bandwidth within which the compensation signal must be generated increases, e.g., in a dual-band transmitter that is expected to operate in any two communication bands over a wide frequency range, such as 1805-2170 MHz, or Bands 3, 9, 35, 39, 33, 37, 2, 36, 34, 4, and 1 in an LTE communication system. It will be appreciated that other frequency ranges and communication bands can be used as examples.

Figure 4:
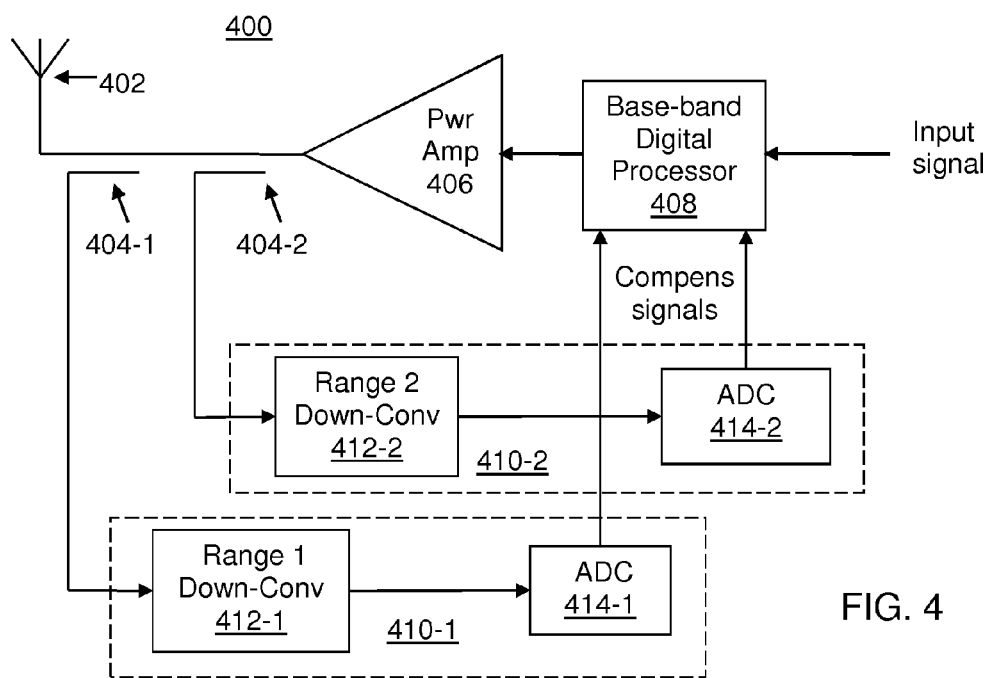
FIG. 4 is a block diagram of a multi-band pre-distortion-compensated transmitter having multiple observation receivers.

One way to overcome the difficulties of a single, wideband TOR 310 is to use multiple TORs, each optimized for a respective communication band or portion of the total transmitter bandwidth. Such an arrangement is depicted in FIG. 4, which is a block diagram of an arrangement 400 that is an example of a pre-distortion-compensated transmitter having two TORs 410-1, 410-2. The transmitter 400 has an antenna 402, couplers 404-1, 404-2, a PA 406, and a base-band digital processor 408. Each of the TORs 410-1, 410-2 includes a respective down-converter 412-1, 412-2 and a respective ADC 414-1, 414-2 that need to operate over only respective frequency ranges Range 1, Range 2, each of which is typically much less than the transmitter's total bandwidth. Accordingly, the down-converters 412 and ADCs 414 can be implemented more easily than the wideband down-converter 312 and wideband ADC 314.

Compared with the transmitter 300, the transmitter 400 eliminates the requirement for a TOR 310 that generates a compensation signal suitable for a signal to be transmitted that is within a very wide bandwidth, e.g., within a bandwidth that simultaneously encompasses plural communication bands. For example, if the transmitter 400 is configured to generate a 40-MHz-wide signal in Band 3 and a 40-MHz-wide signal in Band 1, then the bandwidth of each of the TORs 410-1, 410-2 needs to be only at least 120 MHz (40 MHz×3). Although it is easier to optimize the TORs 410 relative to the TOR 310, the transmitter 400 must have two TORs, and in general as many TORs as signals in the transmitter's multi-band signal to be transmitted, which imposes their associated significant power, area, and cost requirements on the transmitter 400. In addition, the multiple TORs in the transmitter 400 still must be optimized for specific frequencies or frequency ranges.

The arrangements depicted in FIGS. 3 and 4 can be further improved to enable compensating a signal to be transmitted that is within a wide simultaneous bandwidth and achieve efficient multi-band transmitter operation as described below.

Figure 5A:
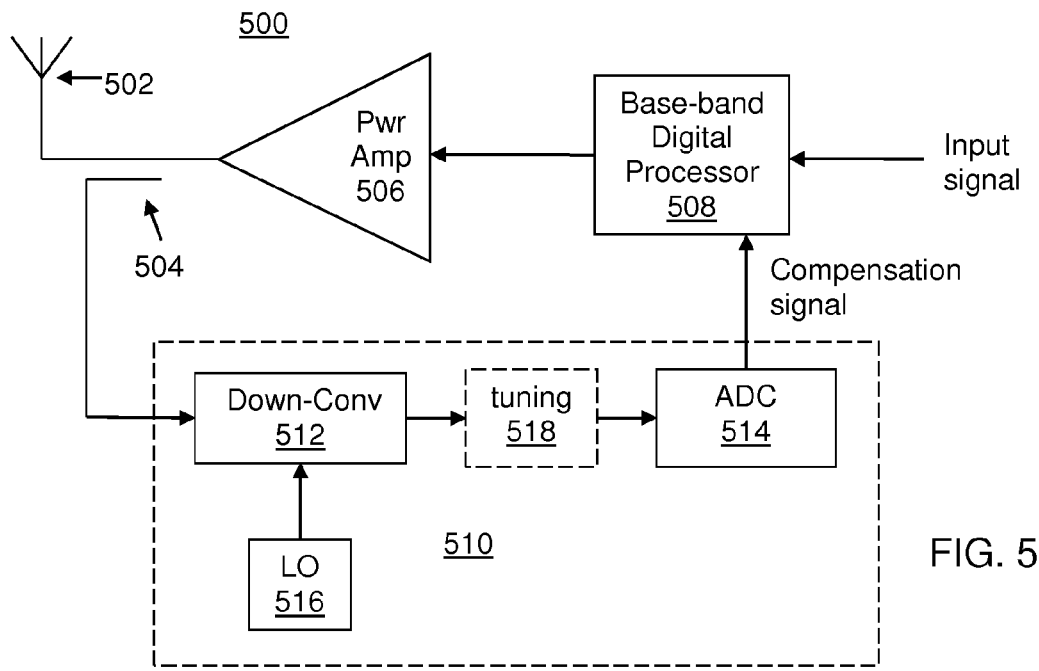
FIG. 5A is a block diagram of a pre-distortion-compensated transmitter having a tunable analog observation receiver.

FIG. 5A is a block diagram of an arrangement 500 that is an example of a pre-distortion-compensated transmitter having a single TOR that is sequentially time-shared among multiple frequency ranges, resulting in generation of a compensation signal suitable for compensating a transmitted signal that is within a bandwidth that can simultaneously encompass a plurality of communication bands of the communication system. The transmitter 500 has an antenna 502, a coupler 504, a PA 506, and a base-band digital processor 508. A TOR 510 depicted in FIG. 5A includes a down-converter 512, an ADC 514, and a local oscillator (LO) 516 or other device that selects the operating frequency range of the down-converter 512. It will be understood that the LO 516 can be considered to part of the down-converter 512.

The base-band processor 508 is typically configured to receive a complex-valued input signal and the fed-back compensation signal, and to output a pre-distorted, up-converted signal. Although FIG. 5A depicts an up-converted, pre-distorted signal provided directly to the PA 506, it will be understood that the pre-distorted signal can be a base-band or intermediate-frequency (IF) signal that is spectrally shifted by suitable components (not shown) as appropriate. Thus, it will further be understood that the processor 508 includes one or more suitable ADCs and digital-to-analog converters (DACs) for converting signals from analog form to digital form and vice versa, as needed.

It will also be understood that the pre-distorted signal generated by the processor 508 is obtained by applying a suitable pre-distortion function to the input signal, advantageously in the digital domain. The pre-distortion function is such that the relationship between the input signal and samples of the PA output signal is substantially linear with constant phase. The pre-distortion function initially can be a predetermined function (e.g., based on a model of the PA) that can then be adapted based on the comparison of the complex input signal with the fed-back sample of the output signal. In this way, compensation signals are generated in the digital domain, even compensation signals that do not strictly comply with the Nyquist criterion and even compensation signals that may linearize transmitted signals in multiple bands based on the transmitted signal in one of those bands.

The power amplifier generates an amplified version of the spectrally shifted, pre-distorted signal to be transmitted in one communication band of a plurality of communication bands used in the communication system. As depicted in FIG. 5A, the TOR 510 advantageously can be optimized for a bandwidth or frequency range that is sufficient to cover the widest communication band of interest to the transmitter 500, and by suitably tuning the LO 516, that bandwidth can be time-shared among all communication bands covered by the transmitter 500. It will be appreciated that the success of the arrangement depicted in FIG. 5A depends on the optimization of the TOR 510 for all communication bands covered by the transmitter 500. The selection of which band to observe is nominally achieved by simply tuning the LO 516, but other tuning components 518 may need to be added or removed from the TOR 510 to compensate for different circuit operation/performance in the different bands and obtain desired performance at the different frequencies.

Figure 5B:
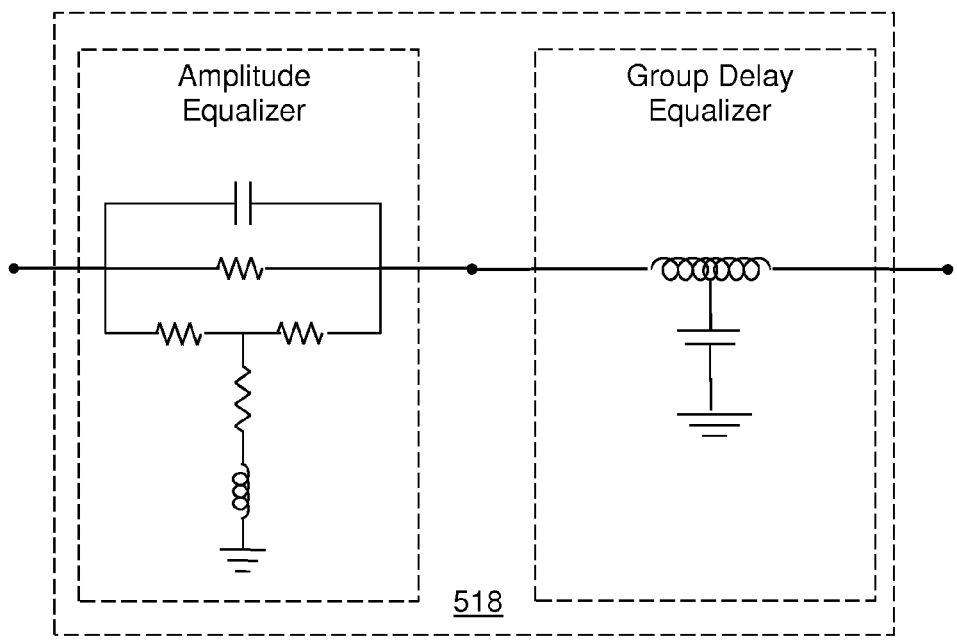
FIG. 5B is a block diagram of a tuning block suitable for a pre-distortion-compensated transmitter having a tunable observation receiver.

FIG. 5B depicts an example of an optional tuning block 518 that is suitable for a pre-distortion-compensated transmitter having a tunable observation receiver, such as the arrangement depicted in FIG. 5A. In general, tuning components can include capacitors and/or inductors that are selectively included/excluded from the TOR 510 by one or more suitable switches or multiplexers, although as depicted in FIG. 5B, the tuning components 518 can be organized into an amplitude equalizer, comprising a resistor-inductor-capacitor (RLC) network having values appropriate for the particular frequency range, and a group-delay equalizer, comprising an LC network with suitable values, that need not be switched in and out of the TOR 510. Even a well-designed wideband analog TOR will show a reduction in gain as the input frequency increases (e.g., as the TOR changes from observing frequencies around Band 3 to frequencies around Band 1). Accordingly, the tuning block 518 is one form of an analog frequency equalizer that can compensate for gain and phase variations with frequency of the TOR. It will be understood that many electrically equivalent arrangements can be used.

An important advantage of a transmitter such as that depicted in FIG. 5A is its reduction of the number of observation receivers to one receiver that is configured for receiving the samples of the PA output signal and generating at least one compensation signal based on the samples such that a signal to be transmitted that can be anywhere within a bandwidth that simultaneously encompasses multiple communication bands is compensated. This saves power/area/cost in exchange for requiring the receiver 510 to be tuned to cover the desired frequency range of the transmitted signal, e.g., multiple communication bands or even multiple portions of a single band.

The arrangement in FIG. 5A can thus be seen as time-sharing a single TOR 510 across more than one communication band or portions of a frequency range by changing the LO frequency and possibly adjusting tuning components. As described above, tuning an analog TOR typically requires different matching components for different frequency ranges of operation, but as illustrated by FIG. 5A, an analog TOR can be used for multiple frequency ranges by setting the LO to new frequencies and selecting and adjusting suitable tuning components.

The arrangement depicted in FIG. 5A can be further improved as described below in connection with FIGS. 6A, 6B.

Figure 6A:
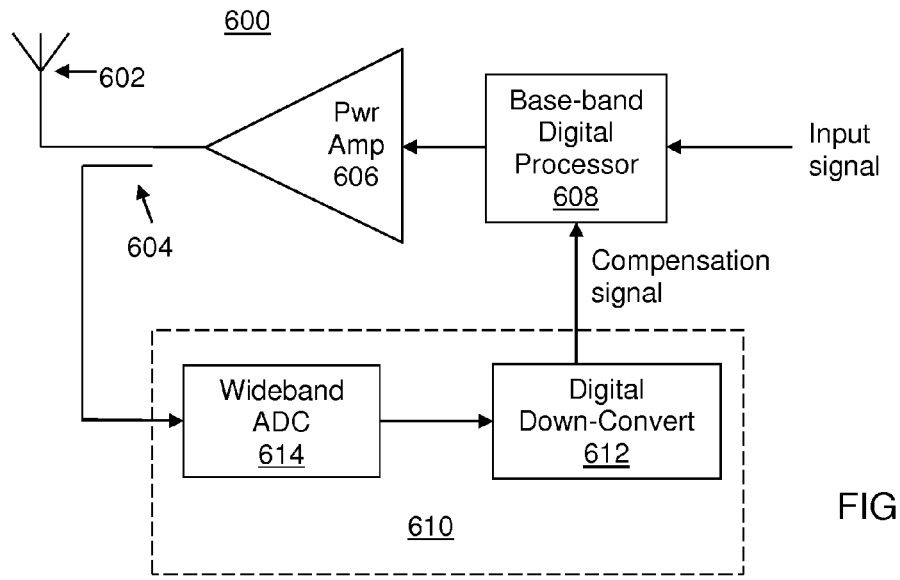
FIGS. 6A, 6B are block diagrams of multi-band pre-distortion-compensated transmitters having tunable digital observation receivers.

FIG. 6A is a block diagram of an arrangement 600 that is an example of a pre-distortion-compensated transmitter having a TOR 610 that includes a digital down-converter 612, such as a suitably programmed digital processor circuit, and a wide-band ADC 614. The TOR 610 is configured for receiving the samples of the PA output signal and generating at least one compensation signal based on the samples. The at least one compensation signal is generated such that a signal to be transmitted that is within a bandwidth that simultaneously encompasses multiple communication bands or frequency ranges is compensated. It will be noted in comparing the TORs 510, 610 that the sampling rate of the ADC 614 is generally greater than the sampling rate of the ADC 514. Wideband ADCs 614 suitable for use in current cellular radio communication systems are commercially available, for example from National Semiconductor Corp., which is now part of Texas Instruments Inc., Dallas, Tex., U.S.A. It will also be noted that FIG. 6A does not explicitly show a LO as FIG. 5A does because the TOR 610 preferably can be implemented with a fixed-frequency LO, with tuning of the TOR 610 implemented digitally rather than by tuning the LO. Nevertheless, the artisan will understand that other arrangements are possible.

In the transmitter 600, filtering and tuning of the sampled transmitted signal preferably is moved to the digital domain. In this way, the repeatability and configurability of digital-domain processing enables easily changing which frequency range, e.g., which communication band, is observed by the TOR 610. By using a digital down-converter 612, errors that would be caused by analog components (e.g., due to time, voltage, and/or temperature variations) are not promulgated back through signals on the transmit path. Moreover, the response of the transmitter can be of the same quality across a wide frequency range, such as a plurality of communication bands. As noted above, TORs that employ analog components generally must be carefully optimized even for a single communication band, and behave differently (and introduce errors) when used at other frequencies. The higher quality of the compensation signal enables the base-band digital processor 608 to achieve a higher quality relationship between the transmitter's input signal and sampled output signal.

The wideband ADC 614 and digital down-converter 612 enable the arrangement 600 to operate in multiple communication bands in a time-shared way as the filter/tuner stage 612 selectively observes one communication band at a time. Thus, the arrangement 600 has power and space advantages over a single-band pre-distortion-compensated transmitter, such as that described in U.S. patent application Ser. No. 13/128,466 filed on Sep. 21, 2011, by Bradley John Morris et al. for "Method and Frequency Agile Pre-Distorted Transmitter Using Programmable Digital Up and Down Conversion", which is a national phase of International Application PCT/IB2010/002941 filed on Nov. 18, 2010. U.S. patent application Ser. No. 13/128,466 is incorporated in this application by reference.

Moreover, the arrangement 600 also has advantages over the transmitter 500 described above in that difficulties arising from re-tuning a TOR for different communication bands can be substantially eliminated by the digital down-converter 612, whose tuning parameters, filter response, etc. can easily be configured as necessary for each band. A suitable digital down-converter 612 is described in U.S. patent application Ser. No. 13/130,211 filed on Sep. 9, 2011, by Bradley John Morris et al. for "Methods and Systems for Programmable Digital Down-Conversion", which is a national phase of International Application PCT/IB2010/002927 filed on Nov. 18, 2010. U.S. patent application Ser. No. 13/130,211 is incorporated in this application by reference.

Figure 6B:
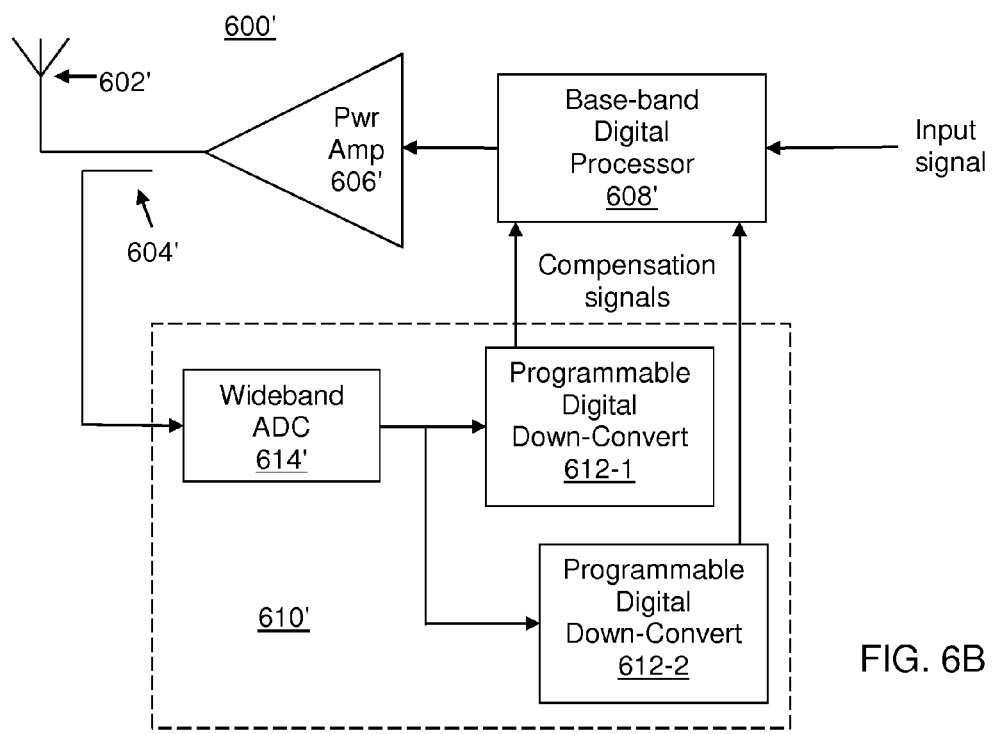

FIG. 6B is a block diagram of an arrangement 600' that is an example of a pre-distortion-compensated transmitter having a TOR 610' that includes plural digital down-converters 612-1, 612-2 and a wideband ADC 614', such as the circuits described above in connection with FIG. 6A. The TOR 610' is configured for receiving the sample signal and generating at least one compensation signal based on samples of the PA output signal. The at least one compensation signal is generated such that a signal to be transmitted that is within a bandwidth that simultaneously encompasses multiple communication bands or frequency ranges is compensated. As in FIG. 6A, it will be noted that FIG. 6B does not explicitly show a LO as FIG. 5A does because the TOR 610' preferably can be implemented with a fixed-frequency LO, with tuning of the TOR 610' implemented digitally rather than by tuning the LO.

The plural down-converters 612-1, 612-2 can be configured in several ways for continuous observation of a given frequency range, such as a communication band or plural communication bands. It will be understood that FIG. 6B depicts two down-converters 612 but more can be included in the arrangement 600'. The arrangement 600' is relatively more efficient than other possible arrangements in that it shares its analog components and wideband ADC among replicated digital functionality. In addition, the transmitter 600' can be advantageous with respect to the transmitter 600 in that the TOR 610' can continuously observe the transmitted signal by using as many digital down-converters 612 as needed.

Figure 7:
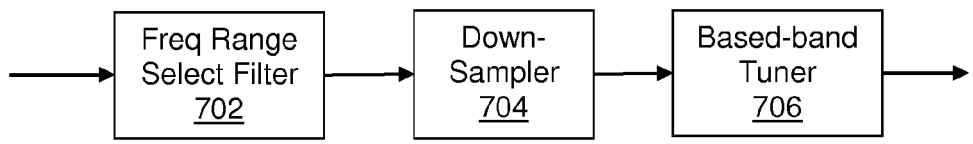
FIG. 7 is a schematic diagram of a programmable digital down-converter for a pre-distortion-compensated transmitter.

FIG. 7 is a schematic diagram of a programmable digital down-converter 612 that is suitable for a pre-distortion-compensated transmitter, such as the arrangements 600, 600'. The converter 612 includes a complex frequency range or band selection filter 702, a digital down-sampler 704, and a complex base-band tuner 706. The complex baseband tuner 706 can alternatively be included in the base-band digital processor 608, 608'. The functionality of the filter 702 and down-sampler 704 can be implemented with a polyphase filter.

The down-sampler 704 is configured to generate a down-sampled signal that includes one sample for each N samples in a digital signal input to the down-sampler, where N is an integer that is greater than or equal to two. Of course, it is preferable for N to be an integer power of two, but a rate-change filter can be included in the down-converter 612 to handle conversion of the sampling rate of the input signal provided to the down-converter divided by N to a desired sampling rate of the output signal generated by the down-converter.

It will be appreciated that a filter is not required before the ADC 614 when there is minimal interference (e.g., something other than the transmitted signal) from the antenna 602 coupled into the feedback path. All required filtering can then be achieved digitally during down-conversion, for example, by judicious selection of polyphase filter coefficients in the programmable digital down-converter 612.

Figure 8:
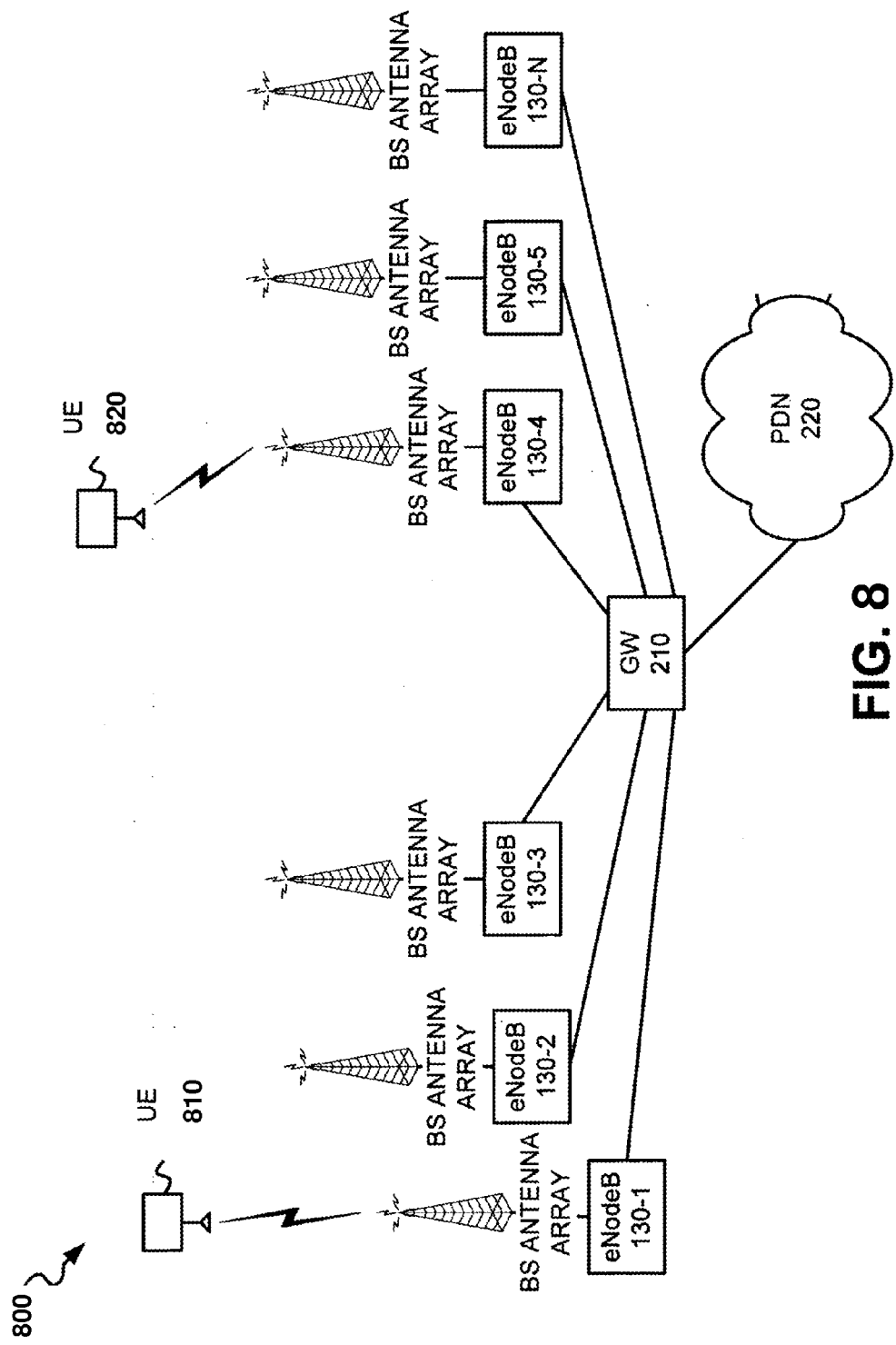
FIG. 8 is a diagram of an example of an LTE cellular communication system.

FIG. 8 is a diagram of an example of an LTE cellular communication system 800 that includes user equipments (UEs) 810, 820, a radio access network (RAN) that includes a plurality of evolved Node B (eNodeBs0, or base stations, 130 1, 130 2, . . . , 130 N, and a core network (CN) that includes a serving gateway (SGW) node 140 and a packet data network 150. Other nodes can also be provided in the system 800.

Each eNodeB 130 1, 130 2, . . . , 130 N serves a respective geographical area that is divided into one or more cells. An eNodeB can use one or more of the pre-distortion-compensated transmitters described above and antennas at one or more sites to transmit information into its cell(s), and different antennas can transmit respective, different pilot and other signals. Neighboring eNodeBs are coupled to each other by an X2-protocol interface that supports active-mode mobility of the UEs. An eNodeB controls various radio network functions, including for example single-cell radio resource management (RRM), such as radio access bearer setup, handover, UE uplink/downlink scheduling, etc. Each eNodeB also carries out the Layer-1 functions of coding, decoding, modulating, demodulating, interleaving, de-interleaving, etc.; and the Layer-2 retransmission mechanisms, such as hybrid automatic repeat request (HARQ), and functions of radio link control (RLC) and RRC. The eNodeBs 130 1, 130 2, ..., 130 N are coupled to one or more SGWs 140 (only one of which is shown in FIG. 8).

The network 800 can exchange information with one or more other networks of any type, including a local area network (LAN); a wide area network (WAN); a metropolitan area network; a telephone network, such as a public switched terminal network or a public land mobile network; a satellite network; an intranet; the Internet; or a combination of networks. It will be appreciated that the number of nodes illustrated in FIG. 8 is simply an example. Other configurations with more, fewer, or a different arrangement of nodes can be implemented. Moreover, one or more nodes in FIG. 8 can perform one or more of the tasks described as being performed by one or more other nodes in FIG. 8. For example, parts of the functionality of the eNodeBs can be divided among one or more base stations and one or more radio network controllers, and other functionalities can be moved to other nodes in the network.

Figure 9:
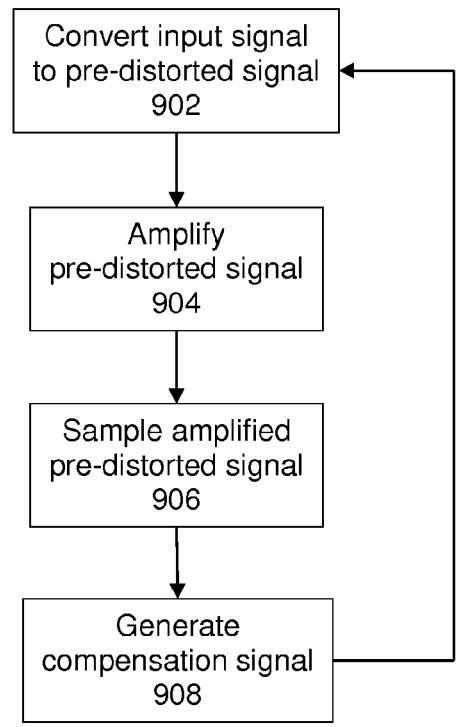
FIG. 9 is a flow chart of a method of pre-distortion-compensating a signal to be transmitted for a communication system.

FIG. 9 is a flow chart of an example of a method of pre-distortion-compensating a signal to be transmitted for a communication system. The method includes converting (step 902) a base-band signal to be transmitted to a spectrally shifted, pre-distorted signal to be transmitted based on at least one compensation signal, for example by a base-band digital processor 608, 608'. The method also includes generating (step 904) an amplified version of the spectrally shifted, pre-distorted signal to be transmitted, for example by a PA 606, 606', where the amplified version is in one communication band of a plurality of communication bands used in the communication system. The method also includes generating (step 906) a sample signal from the amplified version, for example by a coupler 604, 604'. The method also includes generating (step 608) at least one compensation signal based on the sample signal such that a signal to be transmitted that is within a bandwidth that simultaneously encompasses multiple communication bands or frequency ranges is compensated, for example by a TOR 610, 610'. Generating the at least one compensation signal includes converting the sample signal into a digital sample signal, and generating the at least one compensation signal based on the digital sample signal. As described above, the base-band signal to be transmitted is converted such that a relationship between the base-band signal to be transmitted and the sample signal is substantially linear with constant phase.

Also as described above, generating the at least one compensation signal can include generating a plurality of compensation signals, each of which is optimized for a respective frequency range in a plurality of communication bands, and each frequency range can correspond to a respective one of the plural communication bands in a communication system, such as that depicted in FIG. 8. The sample signal can be converted into the digital sample signal by a wideband ADC 614, 614' or equivalent device. Generating the at least one compensation signal can also include tuning to different frequency ranges in the bandwidth by selecting at least one tuning parameter and filter response or analog compensation component.

It is expected that this invention can be implemented in a wide variety of environments, including for example mobile communication devices. It will be appreciated that procedures described above are carried out repetitively as necessary. To facilitate understanding, many aspects of the invention are described in terms of sequences of actions that can be performed by, for example, elements of a programmable computer system. It will be recognized that various actions could be performed by specialized circuits (e.g., discrete logic gates interconnected to perform a specialized function or application-specific integrated circuits), by program instructions executed by one or more processors, or by a combination of both. Many communication devices can easily carry out the computations and determinations described here with their programmable processors and application-specific integrated circuits.

Moreover, the invention described here can additionally be considered to be embodied entirely within any form of computer-readable storage medium having stored therein an appropriate set of instructions for use by or in connection with an instruction-execution system, apparatus, or device, such as a computer-based system, processor-containing system, or other system that can fetch instructions from a medium and execute the instructions. As used here, a "computer-readable medium" can be any means that can contain, store, or transport the program for use by or in connection with the instruction-execution system, apparatus, or device. The computer-readable medium can be, for example but not limited to, an electronic, magnetic, optical, electromagnetic, infrared, or semiconductor system, apparatus, or device. More specific examples (a non-exhaustive list) of the computer-readable medium include an electrical connection having one or more wires, a portable computer diskette, a RAM, a ROM, an erasable programmable read-only memory (EPROM or Flash memory), and an optical fiber.

Thus, the invention may be embodied in many different forms, not all of which are described above, and all such forms are contemplated to be within the scope of the invention. For each of the various aspects of the invention, any such form may be referred to as "logic configured to" perform a described action, or alternatively as "logic that" performs a described action.

It is emphasized that the terms "comprises" and "comprising", when used in this application, specify the presence of stated features, integers, steps, or components and do not preclude the presence or addition of one or more other features, integers, steps, components, or groups thereof.

The particular embodiments described above are merely illustrative and should not be considered restrictive in any way. The scope of the invention is determined by the following claims, and all variations and equivalents that fall within the range of the claims are intended to be embraced therein.

What is claimed is:

1. An arrangement for a pre-distortion-compensated transmitter for a communication system, comprising:
    an electronic processor circuit configured for converting a base-band signal to be transmitted to a spectrally shifted, pre-distorted signal to be transmitted based on at least one compensation signal;
    a power amplifier configured for generating an amplified version of the spectrally shifted, pre-distorted signal to be transmitted, wherein the amplified version is in one frequency range of a plurality of frequency ranges used in the communication system;
    a coupler configured for generating a sample signal from the amplified version; and
    a transmitter observation receiver (TOR) configured for receiving the sample signal and generating at least one compensation signal based on the sample signal,
    wherein the at least one compensation signal is generated such that a signal to be transmitted that is within a bandwidth that simultaneously encompasses multiple frequency ranges is compensated, and the electronic processor circuit converts the base-band signal to be transmitted such that a relationship between the base-band signal to be transmitted and the sample signal is substantially linear with constant phase,
wherein the TOR includes
a common wideband analog-to-digital converter (ADC) configured for converting the sample signal into a digital sample signal, and
a plurality of digital down-converters configured for generating the at least one compensation signal, wherein each of the plurality of digital down-converters is
coupled to the common wideband ADC, and
optimized for a respective frequency range in the plurality of frequency ranges.

2. The arrangement of claim 1, wherein each of the multiple frequency ranges correspond to a respective one of a plurality of communication bands.

3. The arrangement of claim 1, wherein the TOR is configured for tuning to different frequency ranges in the bandwidth by selectively adjusting at least one tuning component of the TOR.

4. A method of pre-distortion-compensating a signal to be transmitted for a communication system, comprising:
converting a base-band signal to be transmitted to a spectrally shifted, pre-distorted signal to be transmitted based on at least one compensation signal;
generating an amplified version of the spectrally shifted, pre-distorted signal to be transmitted, wherein the amplified version is in one communication band of a plurality of communication bands used in the communication system;
generating a sample signal from the amplified version; and
generating the at least one compensation signal based on the sample signal such that a signal to be transmitted that is within a bandwidth that simultaneously encompasses multiple frequency ranges is compensated,
wherein the at least one compensation signal is generated by
converting, by a common wideband (ADC), the sample signal into a digital sample signal, and
separately generating, by a plurality of digital down-converters coupled to the common wideband ADC, separate components of the at least one compensation signal for a respective frequency range in the multiple frequency ranges using the digital sample signal,
wherein the base-band signal is converted such that a relationship between the base-band signal to be transmitted and the sample signal is substantially linear with constant phase.

5. The method of claim 4, wherein each of the multiple frequency ranges corresponds to a respective one of a plurality of communication bands.

6. The method of claim 4, wherein generating the at least one compensation signal includes tuning to different frequency ranges in the bandwidth by selecting at least one tuning component.

* * * * *